④ United States Patent [19]
Wilde

[11] 3,865,624
[45] Feb. 11, 1975

[54] INTERCONNECTION OF ELECTRICAL DEVICES

[75] Inventor: Peter Van Dyke Wilde, Bernardsville, N.J.

[73] Assignee: Bell Telephone Laboratories Inc., Murray Hill, N.J.

[22] Filed: June 29, 1970

[21] Appl. No.: 50,779

[52] U.S. Cl. .................. 117/212, 117/215, 117/217
[51] Int. Cl. .................................. H01l 7/00
[58] Field of Search .... 117/212, 217, 215, DIG. 12; 317/234 N

[56] References Cited

UNITED STATES PATENTS

| | | | |
|---|---|---|---|
| 3,386,894 | 6/1968 | Steppat | 117/212 |
| 3,436,611 | 4/1969 | Perry | 317/235 N X |
| 3,442,701 | 5/1969 | Lepselter | 117/212 |
| 3,525,909 | 8/1970 | Eberhard et al. | 117/DIG. 12 |

*Primary Examiner*—Charles E. Van Horn
*Assistant Examiner*—Jerome W. Massie
*Attorney, Agent, or Firm*—Arthur J. Torsiglieri; P. V. D. Wilde

[57] ABSTRACT

An interconnection pattern involving crossover of conductive paths is provided by a process which involves forming the first conductive pattern by depositing a continuous layer of a conductive material which is convertible in situ to an insulator and, after masking to define the desired first conductive pattern, converting the rest of the layer to an insulator. Then after providing an insulating layer over the first conductive pattern the second conductive pattern is formed over the first conductive pattern. In one embodiment, the first continuous layer is polycrystalline conducting silicon to which is applied a silicon nitride mask to define the first conductive pattern. After conversion of the unmasked silicon to silicon dioxide the mask serves to insulate the first conductive pattern from the subsequently formed second conductive pattern at the crossovers.

6 Claims, 3 Drawing Figures

INVENTOR
P. V. D. WILDE
BY
Arthur J. Torsiglieri
ATTORNEY

INTERCONNECTION OF ELECTRICAL DEVICES

This invention relates to the provision of interconnections in microelectronic apparatus.

BACKGROUND OF THE INVENTION

In microelectronics it is often necessary to provide in one device a high density of electrically isolated conductive paths to interconnect various regions of the device. This usually requires the crossover by one conductive path of a different conductive path. Typical of the problem is the interconnection of different circuit elements in a monolithic integrated circuit. Here a single semiconductive wafer houses a plurality of circuit elements, which internally are isolated from one another by p-n junction isolation techniques, and interconnection therebetween is effected externally by the formation of a plurality of conductive paths on the surface of the wafer, which cross over one another. Similar requirements arise in the fabrication of micromagnetic circuits.

A common method for achieving the desired interconnection involves providing over the wafer an insulating layer and then depositing a continuous conductive layer over the insulating layer, provision being made to reduce the thickness of the insulating layer where electrical connection of the wafer is desired to this first conductive layer. Then portions of this conductive layer are selectively removed to leave behind the first conductive pattern desired. After forming an insulating layer over the conductive pattern just formed and providing regions of reduced thickness of any insulation at regions where the second conductive pattern is to make electrical connection to the wafer, a second continuous conductive layer is deposited and portions of this layer are selectively removed to leave behind the second conductive pattern desired, typically involving portions which cross over portions of the first conductive pattern.

In processes of this kind, low cost and high densities make it important to employ thin insulating layers between separate conductive patterns. However, it is found that the use of thin insulating layers tends to result in a high incidence of faulty crossovers. Some of the faults are attributable to edge effects, the insulating layer being especially prone to defects where it extends over the edges of an underlying conductive pattern, presumably because of the discontinuities produced at such edges.

An object of the present invention is an interconnection technique which reduces this edge effect and so results in fewer defects.

SUMMARY OF THE INVENTION

An illustrative embodiment of the invention is as follows. A monocyrstalline silicon wafer is prepared in the usual manner to include a plurality of circuit elements to be interconnected externally. An insulating layer is included provided with regions of reduced thickness corresponding to where the first conductive pattern is to make electrical connection to the wafer. Where the electrical connection is to be direct, the insulating layer is essentially completely removed; where the electrical connection is capacitive, some of the layer thickness is left. There is then deposited over the insulating layer an unpatterned conductive layer of a material which can be readily converted in situ into an insulator, such as a film-forming metal or conductive silicon. Then there is provided over this conductive layer a mask conforming to the first desired conductive pattern. The unmasked portions of this layer are then converted in situ into insulating material. Advantageously, the mask also is adapted to serve as an insulating layer so that a second conductive layer in which there will be formed the second conductive pattern can be deposited thereover and the mask will serve as insulation at the crossovers. However, before deposit of this second layer of conductive material, provision is made for reducing the thickness of insulation at regions of the wafer where electrical connection, either direct or capacitive, is desired, as was done for the first conductive layer. Thereafter part of this second conductive layer is selectively removed or converted to leave behind a conductive portion corresponding to the desired second conductive pattern.

The invention will be better understood from the following more detailed description taken in conjunction with the accompanying drawing.

DESCRIPTION OF THE DRAWING

FIG. 1 through 3 illustrates a semiconductive wafer in various stages in the process of providing electrical interconnections thereto in accordance with an exemplary embodiment of the invention.

DESCRIPTION OF THE INVENTION

Figure 1:
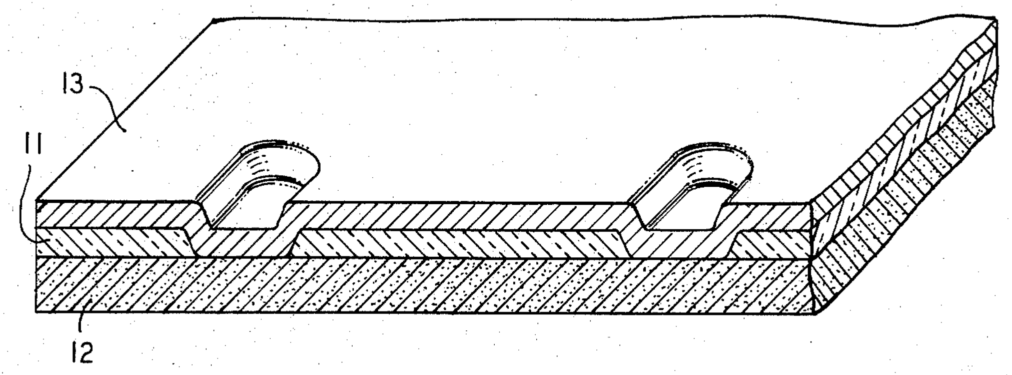

With reference now to the drawing, there will now be described the fabrication of a simple two level interconnection pattern for a silicon monolithic integrated circuit with specific attention to the novel elements.

It will be assumed that there has been prepared in known fashion a monolithic silicon integrated circuit device which includes a number of circuit elements appropriately isolated internally within the silicon wafer by any of the known techniques, such as p-n junction isolation. The details of the circuit elements are not being shown. The emphasis herein will be on the interconnection of these elements externally by conductive patterns deposited on the surface of the silicon wafer.

Typically the surface of the wafer where connections are to be made will include an insulating layer thereover, typically silicon oxide, whose thickness needs to be modified where connection is to be made. Any single connection can be either d-c, in which case the insulating layer needs to be essentially completely removed where such connection is desired, or the connection can be capacitive, as the gate of an insulated gate field effect transistor, in which case the insulating layer is merely thinned appropriately. Moreover even when the connection is to be of the direct current form it may be either ohmic or rectifying, as of the Schottky barrier type. If a Schottky barrier type connection is desired, the area of the wafer where connection is to be made is treated appropriately before the interconnection pattern is deposited. For example, a localized platinum silicide layer may be formed, in known manner, in an opening in the oxide layer.

As shown in FIG. 1, after the silicon oxide layer 11 has been appropriately thinned and any metallizing of exposed areas completed, there is deposited over the wafer 12 a conductive layer 13 of the kind described. Advantageously, the layer is of polycrystalline doped silicon deposited by evaporation or sputtering. In some instances, it may be preferred to utilize a film-forming metal, such as aluminum, tantalum, titanium zirconium, or niobium which can readily be oxidized to form an insulator.

Figure 2:
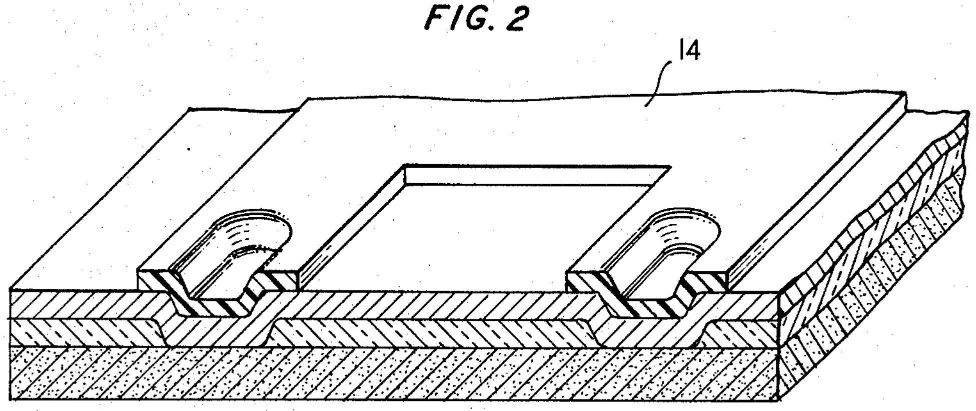
Figure 2:
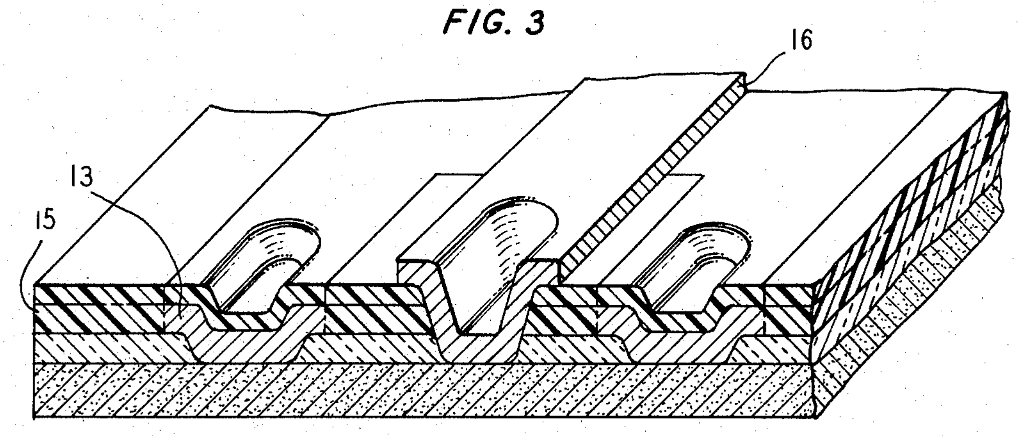

Typically, the thickness of a silicon layer would be between 0.1 to 1$\mu$. After deposition of the layer, a mask 14 is provided thereover to define the first conductive pattern as shown in FIG. 2. This can be done in conventional fashion and typically involves photolithographic techniques. In some instances it will prove advantageous to utilize as the final mask a layer of a material, which can be left in place to serve at least in part as the insulation between the first conductive pattern and subsequently formed conductive patterns. Typical of such materials are silicon nitride, silicon dioxide and aluminum oxide.

After the mask is in place, the surface of the wafer is treated to convert the exposed portions of the conductive layer to the insulator as desired in a manner appropriate to the particular material. If the layer is of silicon, conversion to the oxide can be effected in any suitable manner, as for example by exposure to an oxygen plasma for appropriate periods of time as described in U.S. Pat. No. 3,476,971 issued ot J. R. Ligenza on Nov. 4, 1969, or by oxygen bombardment as disclosed in application Ser. No. 778,285 filed for A. U. Mac Rae on Nov. 22, 1968, now Pat. No. 3,586,542. In the latter case it is important that the mask be sufficiently thick to avoid substantial ion penetration. If the conductive layer is of a film-forming metal, it may be preferable to convert the unmasked portion to an insulating oxide by electrolytic techniques, for example as is common in the solid electrolytic capacitor art.

It can be appreciated that by this technique of formation, the conductive pattern 13 is left imbedded in an insulating matrix 15, as seen in FIG. 3. The conversion to an insulator will generally involve an increase in bulk with a consequent increase in height of the insulator portion. However, the discontinuity presented at the transitions from conductive material to insulating material typically will be less than would be the case if the insulating portion were completely removed.

Moreover, if the mask is of a material suitable for use as an insulator between the first conductive pattern and a second conductive pattern to be formed thereover, as is the case when it is of silicon nitride, the mask thickness advantageously can serve to reduce still further and discontinuity in planarity occurring at the transition between the converted and unconverted material as is illustrated in FIG. 3.

If the mask is not to be used in this way, it can be removed and a new layer of additional insulating material formed over both the converted and unconverted material. In some instances, it may be feasible to convert a surface portion of the conducting pattern to form the insulator, or alternatively insulating material may be deposited. In some instances, it may be advantageous both to retain the mask and to deposit an additional insulating layer over it and the converted material.

Next there are formed by conventional techniques regions of reduced thickness, as was done before deposition of the first conductive pattern, where connection either d-c or capacitive is to be made to the wafer by the second conductive pattern.

Then there is deposited uniformly over the wafer a second conducting layer of a material suitable for use in the second conductive pattern. If there is to be a third conductive pattern, which is to cross over this second pattern and if it is important to avoid crossover problems, then the second conducting layer advantageously is of a material chosen in the light of the same considerations affecting the choice of the first layer, and the second conductive pattern is formed therefrom in a manner analogous to the formation of the first conductive pattern. If there is no need to be concerned about subsequent crossovers, the material for the second conductive layer and the formation therefrom of the second conductive pattern can follow the practice presently in the art. This typically involves deposition of a metal layer, such as aluminum or titanium or a composite, the formation thereover by photolithographic techniques of an etch-resistant mask defining the desired conductive pattern, and the selective removal by etching of the unmasked material to leave behind the desired second conductive pattern 16 as seen in FIG. 3. It is significant to recognize that the composite layers in the vicinity of the crossover are essentially planar so as to minimize the occurrence of the edge defects alluded to before.

It will be apparent that the various embodiments described are merely illustrative of the general principles of the invention. In particular, a variety of other materials can be used without departing from the spirit and scope of the invention. For example, it is unnecessary that the conductive layer be converted into an oxide and in some instances as when the conductive layer is silicon to convert it to a nitride as by treatment in a nitrogen plasma, or to a carbide in known fashion. Also in some instances, it may be feasible to convert the desired portion of the conductive layer by irradiation in accordance with the desired pattern by a laser, ion or electron beam.

What is claimed is:

1. A method for forming a crossover interconnection pattern for a silicon integrated circuit device comprising the steps of depositing a layer of a conductive material which can be selectively converted to an insulator over an insulator-coated monocrystalline semiconductive wafer, the layer making connection to the wafer at selected regions, providing an insulating mask over the layer, to protect a region of the layer corresponding to a desired first conductive pattern, exposing the masked wafer to an oxidizing atmosphere to convert the unprotected region of the layer to an oxide and to form the first conductive pattern imbedded in such oxide, depositing a conductive layer over the still masked and imbedded conductive pattern, and forming from said last-mentioned layer a second conductive pattern electrically isolated from the first conductive pattern and making connection to the wafer, with part of the second conductive pattern crossing over part of the first conductive pattern.

2. The method of claim 1 including the additional step of forming a continuous insulating layer over the imbedded conductive pattern prior to forming the second conductive pattern.

3. The method of claim 1 in which the imbedded conductive layer is of polycrystalline conductive silicon.

4. The method of claim 1 in which the imbedded conductive layer is of a film-forming metal.

5. The method of claim 1 in which the mask is of silicon nitride.

6. The method of claim 5 in which the silicon nitride mask serves as the insulation between the first and second conductive patterns.

* * * * *